(12) United States Patent
Hara et al.

(10) Patent No.: US 7,742,352 B1
(45) Date of Patent: Jun. 22, 2010

(54) VARIABLE SENSE LEVEL FOR FUSE-BASED NON-VOLATILE MEMORY

(75) Inventors: Susumu Hara, Austin, TX (US); Jeffrey S. Batchelor, Austin, TX (US); Jeffrey L. Sonntag, Portland, OR (US)

(73) Assignee: Silicon Laboratories Inc., Austin, TX (US)

( * ) Notice: Subject to any disclaimer, the term of this patent is extended or adjusted under 35 U.S.C. 154(b) by 294 days.

(21) Appl. No.: 11/927,845

(22) Filed: Oct. 30, 2007

(51) Int. Cl.
*G11C 7/02* (2006.01)

(52) U.S. Cl. .................... 365/210.1; 365/103; 365/207; 365/208; 365/210.11

(58) Field of Classification Search .................. 365/94, 365/103 X, 207 X, 208 X, 210.1, 210.11 X
See application file for complete search history.

(56) References Cited

U.S. PATENT DOCUMENTS

| | | | |
|---|---|---|---|
| 4,730,273 A | 3/1988 | Sluss | |
| 5,731,733 A | 3/1998 | Denham | |
| 5,789,970 A | 8/1998 | Denham | |
| 5,959,445 A | 9/1999 | Denham | |
| 6,121,820 A | 9/2000 | Shishikura | |
| 6,208,549 B1 | 3/2001 | Rao et al. | |
| 6,370,060 B2 * | 4/2002 | Takata et al. | 365/185.21 |
| 6,384,664 B1 | 5/2002 | Hellums et al. | |
| 6,417,720 B1 | 7/2002 | Denham | |
| 6,670,843 B1 | 12/2003 | Moench et al. | |
| 6,903,986 B2 | 6/2005 | Hejdeman et al. | |
| 6,906,557 B1 | 6/2005 | Parker et al. | |
| 7,030,641 B1 | 4/2006 | Tang et al. | |
| 7,098,721 B2 | 8/2006 | Ouellette et al. | |
| 7,145,346 B2 | 12/2006 | Chung et al. | |
| 7,183,836 B2 | 2/2007 | Parker et al. | |
| 7,208,994 B2 | 4/2007 | Parker et al. | |
| 7,215,175 B1 | 5/2007 | Mandal et al. | |
| 7,221,210 B2 | 5/2007 | Parker et al. | |
| 7,535,783 B2 * | 5/2009 | DeBrosse et al. | 365/208 |

OTHER PUBLICATIONS

Alavi, Mohsen, et al., "A Prom Element Based on Salicide Agglomeration of Poly Fuses in a CMOS Logic Process," International Electron Devices Meeting (IEDM 97), 1997, pp. 855-858.

* cited by examiner

*Primary Examiner*—Van Thu Nguyen
(74) *Attorney, Agent, or Firm*—Zagorin O'Brien Graham LLP

(57) ABSTRACT

Techniques for use with a fuse-based non-volatile memory circuit include digitally controlling a resistance threshold of the circuit. The circuit includes a fuse circuit and a comparator circuit. The comparator circuit is configured to compare a first signal indicative of the fuse resistance to a second signal indicative of a reference level. At least one of the first and second signals is digitally controllable. The comparator circuit is configured to generate a digital output signal indicative of the comparison. The circuit may include a first digital-to-analog converter circuit configured to generate a first analog signal based on at least a first plurality of digital signals. The first signal is at least partially based on the first analog signal. The circuit may include a control circuit configured to digitally control the digitally controllable ones of the first and second signals at least partially based on the digital output signal.

24 Claims, 11 Drawing Sheets

VARIABLE SENSE LEVEL FOR FUSE-BASED NON-VOLATILE MEMORY

BACKGROUND

1. Field of the Invention

The present invention relates to integrated circuits and more particularly to integrated circuits including resistor-based non-volatile memory circuits.

2. Description of the Related Art

In general, a non-volatile memory circuit is used to store information. For example, a resistor-based non-volatile memory circuit uses unprogrammed and permanently programmed devices to represent different logic states. A sense amplifier may be used to determine the state of the non-volatile memory circuit, i.e., distinguish between the programmed and unprogrammed state of the device by sensing a resistance of the device. A high resistance corresponds to a logic '1' and a low resistance corresponds to a logic '0.' Exemplary devices used in non-volatile memory circuits include metal-fuses, polysilicon-fuses, MOS gate resistances, or other suitable devices.

SUMMARY

Techniques for use with a fuse-based non-volatile memory circuit include digitally controlling a resistance threshold of the circuit. In at least one embodiment of the invention, a circuit includes a fuse circuit and a comparator circuit. The comparator circuit is configured to compare a first signal indicative of the fuse resistance to a second signal indicative of a reference level. At least one of the first and second signals is digitally controllable. The comparator circuit is configured to generate a digital output signal indicative of the comparison. In at least one embodiment of the invention, the circuit includes a first digital-to-analog converter circuit configured to generate a first analog signal based on at least a first plurality of digital signals. The first signal is at least partially based on the first analog signal. In at least one embodiment of the invention, the circuit includes a control circuit configured to digitally control the digitally controllable ones of the first and second signals at least partially based on the digital output signal.

In at least one embodiment of the invention, a method includes digitally controlling at least one of a first signal indicative of a resistance of a fuse circuit and a second signal indicative of a reference level. The method includes generating a digital output signal indicative of a comparison of the first and second signals. In at least one embodiment of the invention, the first and second signals are digitally controlled to generate a reference voltage based on the reference level and to generate a current through the fuse circuit. The ratio of the reference voltage level to the current through the fuse circuit is approximately a target resistance threshold level. In at least one embodiment of the invention, at least one of the first and second signals is digitally controlled at least partially based on the digital output signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

During programming of a memory circuit including fuse circuits, an individual fuse circuit may be programmed to indicate a particular logic level using any suitable technique. In an exemplary memory circuit, the fuse circuits are formed to have a first resistance (e.g., a low resistance) that will be indicative of a logic level '0.' During programming, a fuse circuit being programmed to a logic level '1' may be blown, e.g., by applying a substantial current through the fuse circuit that changes the resistance of the fuse circuit from the first resistance to a second resistance (e.g., a high resistance, i.e., a resistance substantially greater than the first resistance). During development, the actual resistance of a fuse circuit or other non-volatile memory circuit device may be determined using test structures. However, on a production integrated circuit, available circuitry may only determine the logic level state of the fuse circuit included in the memory circuit and provide no other information regarding the actual resistance of the fuse circuit.

Figure 1:
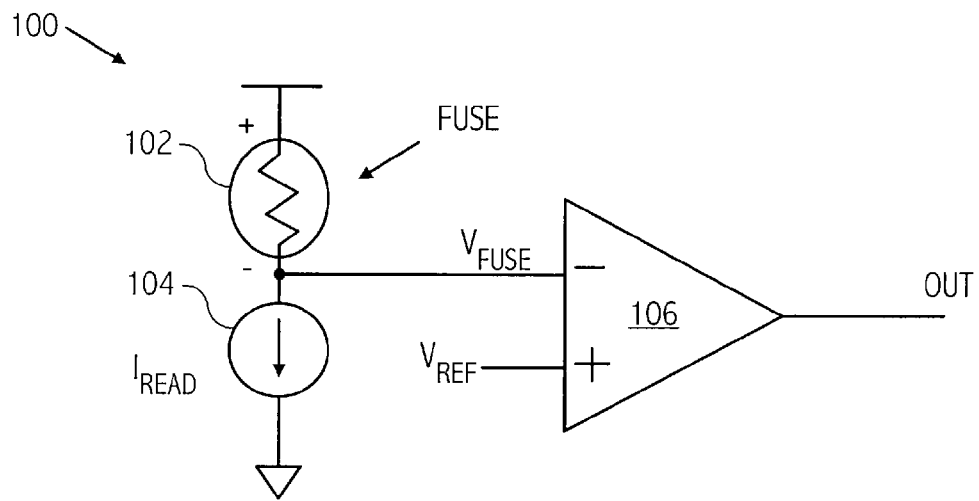
FIG. 1 illustrates an exemplary fuse circuit and an exemplary sensing circuit.

Referring to FIG. 1, a logic level of a fuse circuit (e.g., fuse circuit 102) may be determined by establishing a known current (e.g., $I_{READ}$) through the fuse. A voltage (e.g., $V_{FUSE}$) developed on a terminal (e.g., the negative terminal) of fuse circuit 102 is compared to a reference voltage (e.g., $V_{REF}$) by a sense amplifier (e.g., differential amplifier circuit 106). If $V_{FUSE}$ is greater than $V_{REF}$, differential amplifier circuit 106 generates a signal indicative of a '0' logic level. If $V_{FUSE}$ is less than $V_{REF}$, differential amplifier circuit 106 generates a signal indicative of a '1' logic level. The ratio of $V_{REF}$ to $I_{READ}$ is the resistance threshold or trip resistance (i.e., $R_{TRIP}$) of circuit 100.

Figure 2:
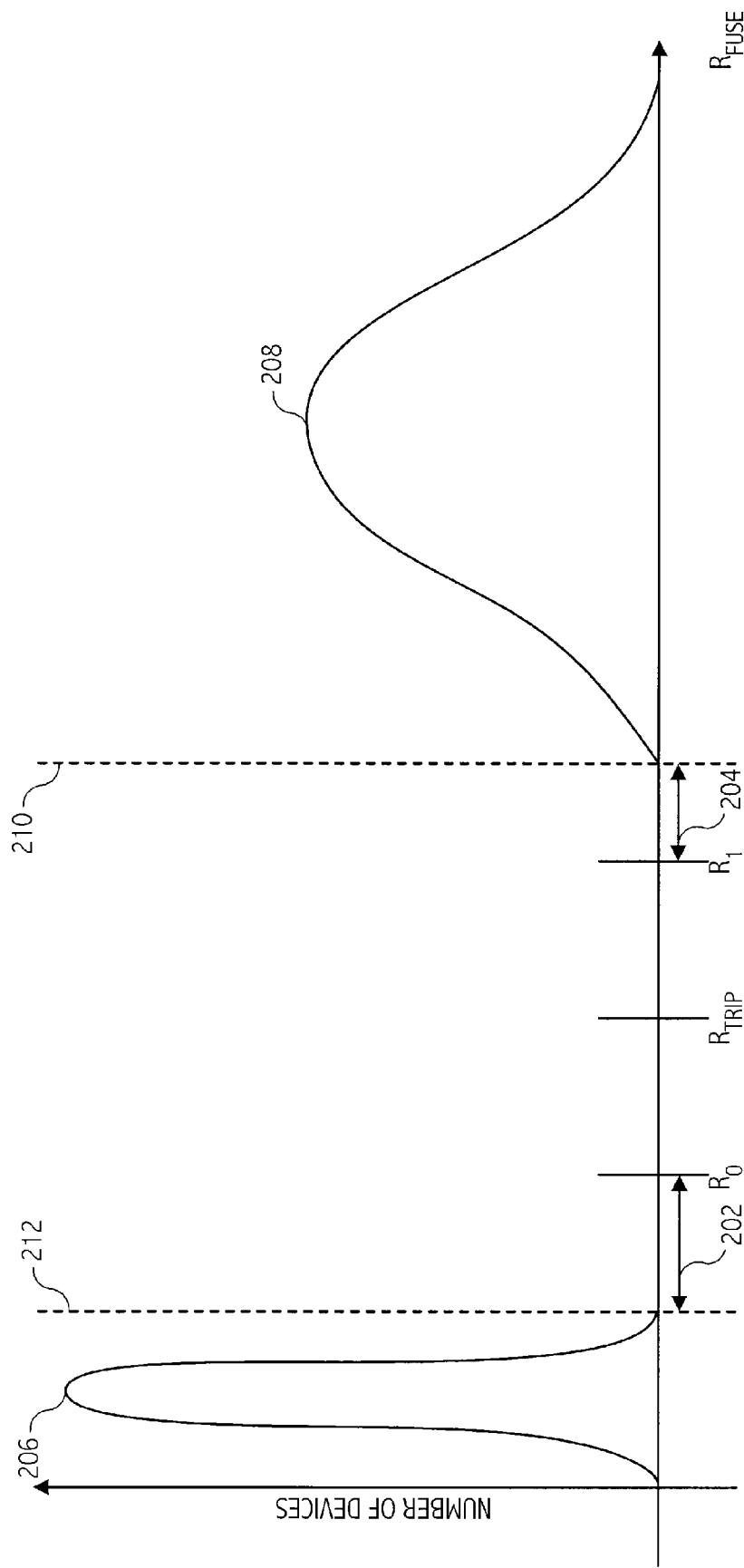
FIG. 2 illustrates an exemplary distribution of resistances of unprogrammed fuse circuits and an exemplary distribution of resistances of programmed fuse circuits.

Referring to FIG. 2, prior to programming fuse devices, the fuse devices may have resistance values distributed over a range of resistance values (e.g., having a mean value of approximately 100Ω) that are less than $R_0$, with margin 202. Prior to programming, if any of the fuse devices have a resistance greater than $R_0$, the fuse device is considered defective. After programming, the programmed fuse devices may have resistance values distributed over a range of resistance values (e.g., having a mean value of 10 kΩ) that are greater than $R_1$, with margin 204. After programming, if any of the programmed fuse devices have a resistance value less than $R_1$, the fuse device is considered defective. However, if an unprogrammed fuse device has resistance 212 or a programmed fuse device has a resistance 210 at the time of production testing, later, the resistance of the fuse device may shift to a resistance value that is considered in the defective resistance range (e.g., $R_0 < R < R_1$). Note that although $R_{TRIP}$ is illustrated as having a particular resistance value (e.g., $V_{REF}/I_{READ}$) in between $R_0$ and $R_f$, noise and gain of the differential amplifier circuit may introduce some uncertainty into the effective value of $R_{TRIP}$. Accordingly, $R_{TRIP}$ may be modeled as a range of resistances (e.g., a range around $V_{REF}/I_{READ}$). To ensure a deterministic output of the sensing amplifier, a resistance of a fuse device should have sufficient margin with respect to the range of $R_{TRIP}$, i.e., the resistance of the fuse device should provide sufficient slice level margin (e.g., slice level margin is $|V_{FUSE} - V_{REF}|$ for a slice level of $V_{REF}$).

Referring back to FIG. 1, the logic level of fuse circuit 102 alone is insufficient to determine the actual resistance value of fuse circuit 102 and whether fuse circuit 102 is unintentionally programmed or not for a memory circuit at the time of production testing. In addition, the logic level of fuse circuit 102 provides little or no information regarding aging effects on a memory circuit including fuse circuit 102. Furthermore, the logic level of fuse circuit 102 provides no information regarding slice level margin of the memory circuit. An incompletely blown fuse circuit cannot be detected during manufacturing test. However, aging effects may cause a logic state change of an incompletely blown fuse after the integrated circuit is deployed by a customer. Although the resistance of a fuse circuit may be determined by probing an integrated circuit, probing may be extremely difficult due to the density of metal structures. In addition, unwanted resistance may be introduced by physical contacts to the fuse device, thereby compromising the resistance measurement obtained by probing the integrated circuit.

Figure 3:
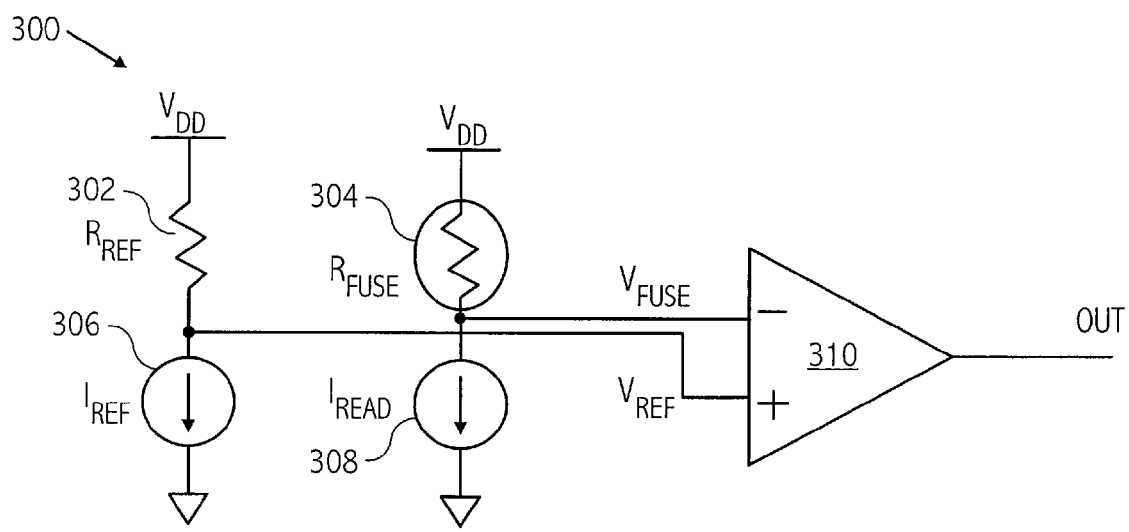
FIG. 3 illustrates an exemplary fuse and sensing circuit consistent with at least one embodiment of the invention.

Referring to FIG. 3, in at least one embodiment of a fuse-based circuit, a fixed voltage (e.g., $V_{DD}$) is provided to one terminal of fuse device 304 and a known current (e.g., $I_{READ}$) is established through fuse device 304. The voltage on the negative terminal of fuse circuit 304, $V_{FUSE}$, is compared to a known voltage $V_{REF}$. The resistance threshold of the system (i.e., $R_{TRIP}$) may be varied by changing $V_{REF}$ and/or $I_{READ}$. By monitoring the trip point, i.e., the voltage $V_{REF\_TRIP}$ that results in a change in a digital level of the output of differential amplifier circuit 310, the voltage $V_{FUSE}$ may be determined. Then, $R_{FUSE}$ may be determined at the trip point from the known values of $I_{READ\_TRIP}$ and $V_{FUSE\_TRIP}$.

The point at which the logic value of the output of differential amplifier circuit 310 changes state (i.e., from '1' to '0' or from '0' to '1') is referred to herein as the trip point of circuit 300. At the trip point, $V_{REF\_TRIP}$ is approximately equal to $V_{FUSE}$. The trip point may be determined by observing the output over time for each particular value of $I_{READ\_TRIP}$ and/or $V_{REF\_TRIP}$. For example, at the trip point, a large number of measurements (e.g., 1 million measurements) will result in approximately 50% logic '0' output of differential amplifier circuit 310 and 50% logic '1' output of differential amplifier circuit 310. The value of $V_{REF\_TRIP}$ or $V_{FUSE\_TRIP}$ and the value of $I_{READ\_TRIP}$ at the trip point are used to determine $R_{FUSE}$ (e.g., $R_{FUSE} = (V_{DD} - V_{REF\_TRIP})/I_{READ\_TRIP}$).

In at least one embodiment of a fuse-based circuit, a fixed voltage (e.g., $V_{DD}$) is provided to one terminal of fuse device 304 and a variable current (e.g., $I_{READ}$) flows through the fuse device. By changing the current that flows through fuse device 304, thereby changing the resistance threshold of the system (i.e., $R_{TRIP}$), and monitoring the trip point based on a known value of $V_{REF}$, the voltage $V_{FUSE}$ may be determined. Then, $R_{FUSE\_TRIP}$ may be determined from the known values of $I_{READ}$ and $V_{FUSE}$ at the trip point.

The reference voltage, $V_{REF}$, may be generated by any suitable technique. In at least one embodiment, $V_{REF}$ is generated by using a resistor (e.g., resistor 302) having a fixed resistance (e.g., $R_{REF}$) and a fixed current source (e.g., current source 306, having a current $I_{REF}$). In at least one embodiment, resistor 302 is a precision resistor. In at least one embodiment, resistor 302 has a structure substantially similar to an unprogrammed (e.g., an unblown) fuse and/or is made of the same materials as a fuse device.

The resistance of fuse device 304 may also be determined by varying both $I_{READ}$ or/and $V_{REF}$ in a controlled manner, thereby changing the resistance threshold of the system (i.e., $R_{TRIP}$), and monitoring corresponding outputs of differential amplifier circuit 310. Then, $R_{FUSE}$ may be determined from known values of $I_{READ}$ and $V_{FUSE}$ at the trip point. In addition, slice level margin associated with differential amplifier circuit 310 may be determined and varied by measuring and adjusting, respectively, $V_{FUSE}$ and/or $V_{REF}$. As referred to herein, slice level margin is the difference between $V_{REF}$ and $V_{FUSE}$. Note that the slice level margin may be different for programmed and unprogrammed fuses. A production test may use slightly different values of $V_{REF}$ (e.g., $V_{REF}+\Delta$ or $V_{REF}-\Delta$) and monitor the logic output of differential amplifier circuit 310 to determine whether a programmed fuse evaluates to a logic level of '1' and an unprogrammed fuse evaluates to a logic level of '0,' to thereby determine a slice level margin of differential amplifier circuit 310.

Figure 4A:
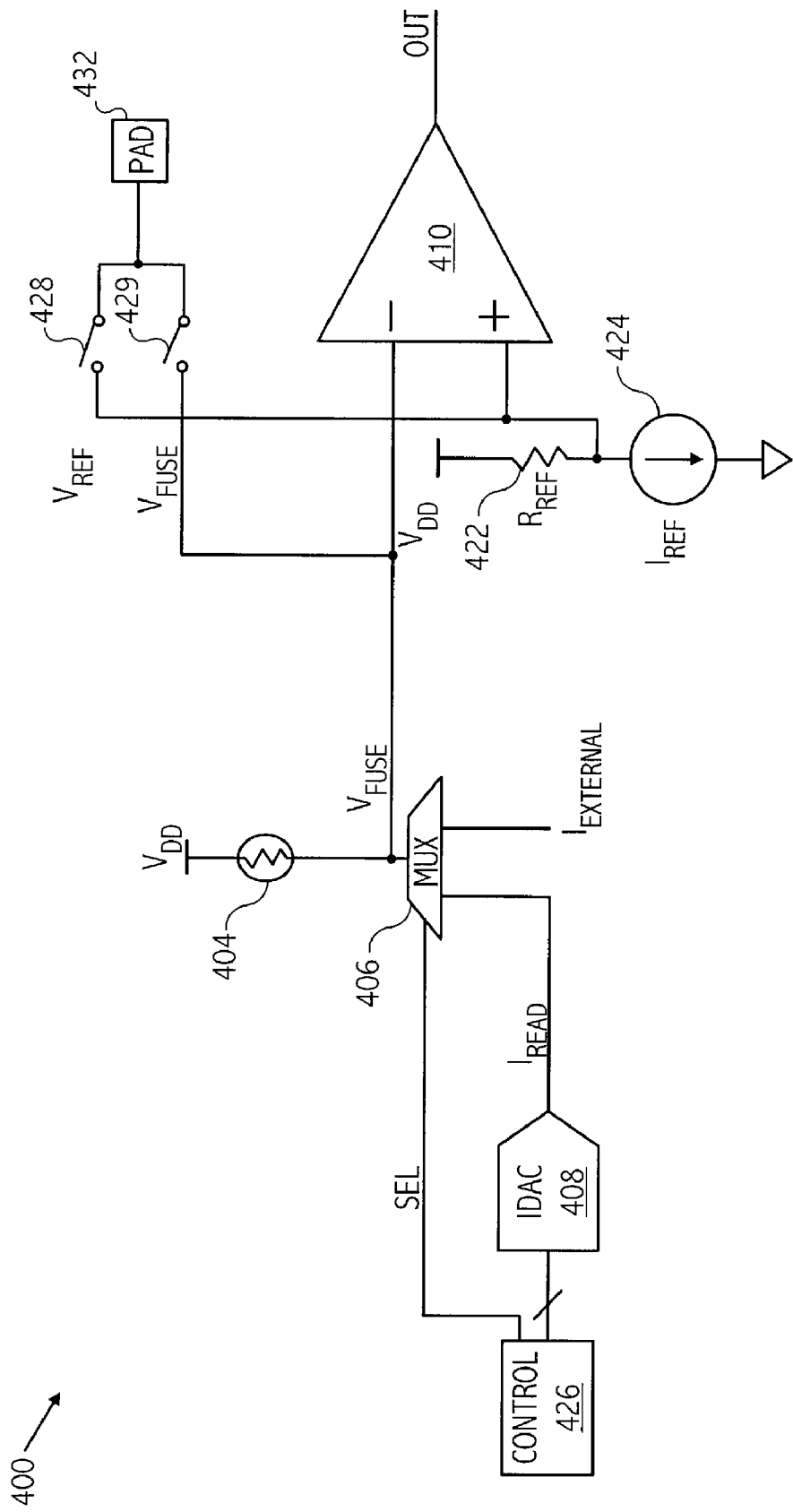
FIGS. 4A-D illustrate exemplary configurations of fuse circuits and sensing circuits consistent with specific embodiments of the invention.

Referring to FIG. 4A, in at least one embodiment of a fuse-based circuit, a variable voltage on a node of the fuse circuit (e.g., $V_{FUSE}$ of fuse 404)) is compared to a fixed reference voltage by differential amplifier circuit 410. The fixed reference voltage is generated by $I_{REF}$ and $R_{REF}$. The trip resistance of circuit 400 is based on a ratio of $I_{REF}$ to $I_{READ}$, i.e., $R_{TRIP} = (R_{REF} \times I_{REF})/I_{READ}$. The variable voltage is provided by a select circuit (e.g., multiplexer circuit 406) to the node by selecting either an externally generated variable current (e.g., $I_{EXTERNAL}$) or an internally generated variable current (e.g., $I_{READ}$) according to a control signal (e.g., SEL). The internally generated variable current may be generated by any suitable technique. In at least one embodiment, control circuit 426 provides an N-bit digital control word (e.g., N>1) indicative of the magnitude of the variable current to a digital-to-analog converter circuit (e.g., IDAC 408), which generates the read current (i.e., $I_{READ}$) analog control signal based on the N-bit digital word. For example, IDAC 408 generates a signal having one of $2^8$ current levels, based on an 8-bit digital word. Note that IDAC 408 may be any suitable digital-to-analog converter circuit. In addition, note that other variable current source circuits may be used. For example, in at least one embodiment, the internally generated variable current is generated according to an analog control signal provided to a variable current source. The analog control signal may be generated by a voltage digital-to-analog converter circuit and a variable current source may generate a current having a magnitude according to the voltage of that analog signal.

Control circuit 426 may vary the digital control word, thereby varying the value of $V_{FUSE}$ and the system resistance threshold level of the system, e.g., by incrementing or decrementing the digital control word periodically and allowing differential amplifier circuit 410 to generate a digital output signal for a suitable number of measurements for each value of the digital control word. By varying $V_{FUSE}$ (either internally by using control circuit 426 and IDAC 408 or externally by using an external current generator) and monitoring the output of differential amplifier circuit 410, the value of $R_{FUSE}$ and/or the amount of slice margin of a fuse circuit may be determined. In addition control circuit 426 may vary the digital control word based on those determined values to approximate a target resistance threshold level of circuit 400.

In at least one embodiment of a fuse-based circuit, a monitor circuit (e.g., a circuit including analog switches 428 and 429) provides $V_{REF}$ and/or $V_{FUSE}$ to an external node for observation external to an integrated circuit including circuit 400. For example, analog switch 428 may be used to provide $V_{REF}$ to pad 432 for external measurements and observation. In at least one embodiment, analog switch 429 and pad 432 are used to provide an external read current (e.g., $I_{EXTERNAL}$) to fuse circuit 404. Rather than having a separate analog switch to provide the voltage $V_{FUSE}$ to pad 432, this function may be performed by a switch that is shared with another function (e.g., an analog switch included in multiplexer 406). In addition, although a single pad is illustrated for measuring $V_{REF}$ and $V_{FUSE}$, one or more additional pads (e.g., an additional pad coupled to $I_{EXTERNAL}$ of FIG. 4A) may be used to facilitate a Kelvin resistance measurement, which is a sensing technique that uses separate pairs of current-carrying and voltage-sensing electrodes to measure the system resistance.

Figure 4B:
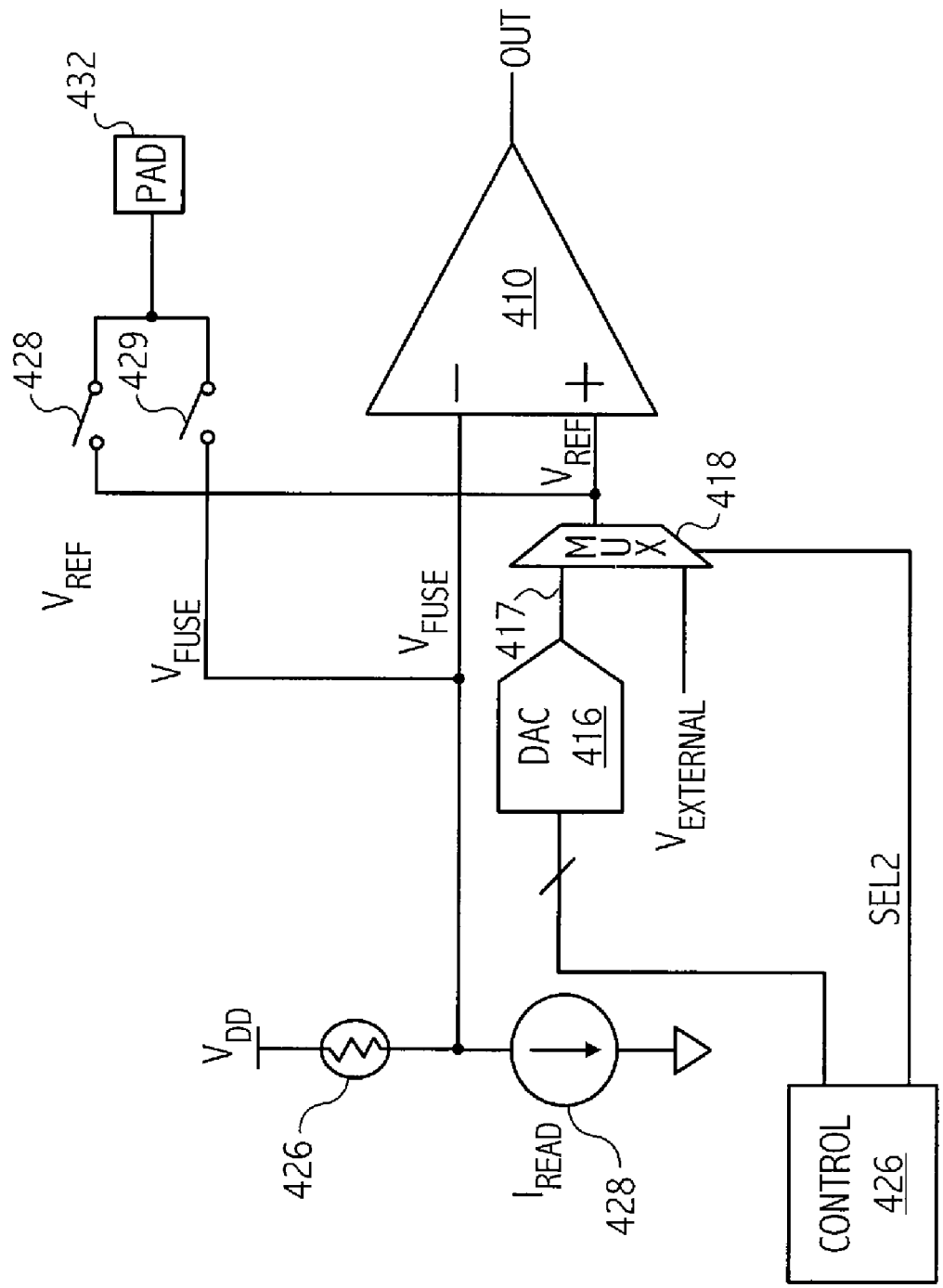

Referring to FIG. 4B, in at least one embodiment of a fuse-based circuit, differential amplifier circuit 410 compares a variable voltage (e.g., $V_{REF}$) on a reference node to a fixed voltage (e.g., $V_{FUSE}$) on a node of fuse circuit 426. The variable voltage is provided by a select circuit (e.g., multiplexer circuit 418) to the node by selecting either an externally generated variable voltage (e.g., $V_{EXTERNAL}$) or an internally generated variable voltage. In at least one embodiment, the internally generated variable voltage (e.g., $V_{417}$) is generated by a digital-to-analog converter 416 (e.g., DAC 416). Control circuit 426 provides an N-bit digital word (e.g., N>1) to DAC 416, which converts the N-bit digital word into an analog voltage (i.e., a signal having one of a $2^N$ voltage levels, e.g., signal $V_{417}$). Note that DAC 416 may be any suitable digital-to-analog converter circuit. In addition, other variable voltage reference generator circuits may be used.

In at least one embodiment of a fuse-based circuit, control circuit 426 may vary the digital control word, thereby varying the value of $V_{417}$ and the system resistance threshold level, e.g., by incrementing or decrementing the digital word to allow differential amplifier circuit 410 to make a suitable number of measurements. By varying $V_{REF}$, either internally using DAC 416 and control circuit 426 or by using an external voltage generator, and monitoring the output of differential amplifier circuit 410, the value of $R_{FUSE}$ and/or the amount of slice margin associated with differential amplifier circuit 410 may be determined. In addition control circuit 426 may vary the digital control word based on those determined values to approximate a target resistance threshold level of circuit 400.

Figure 4C:
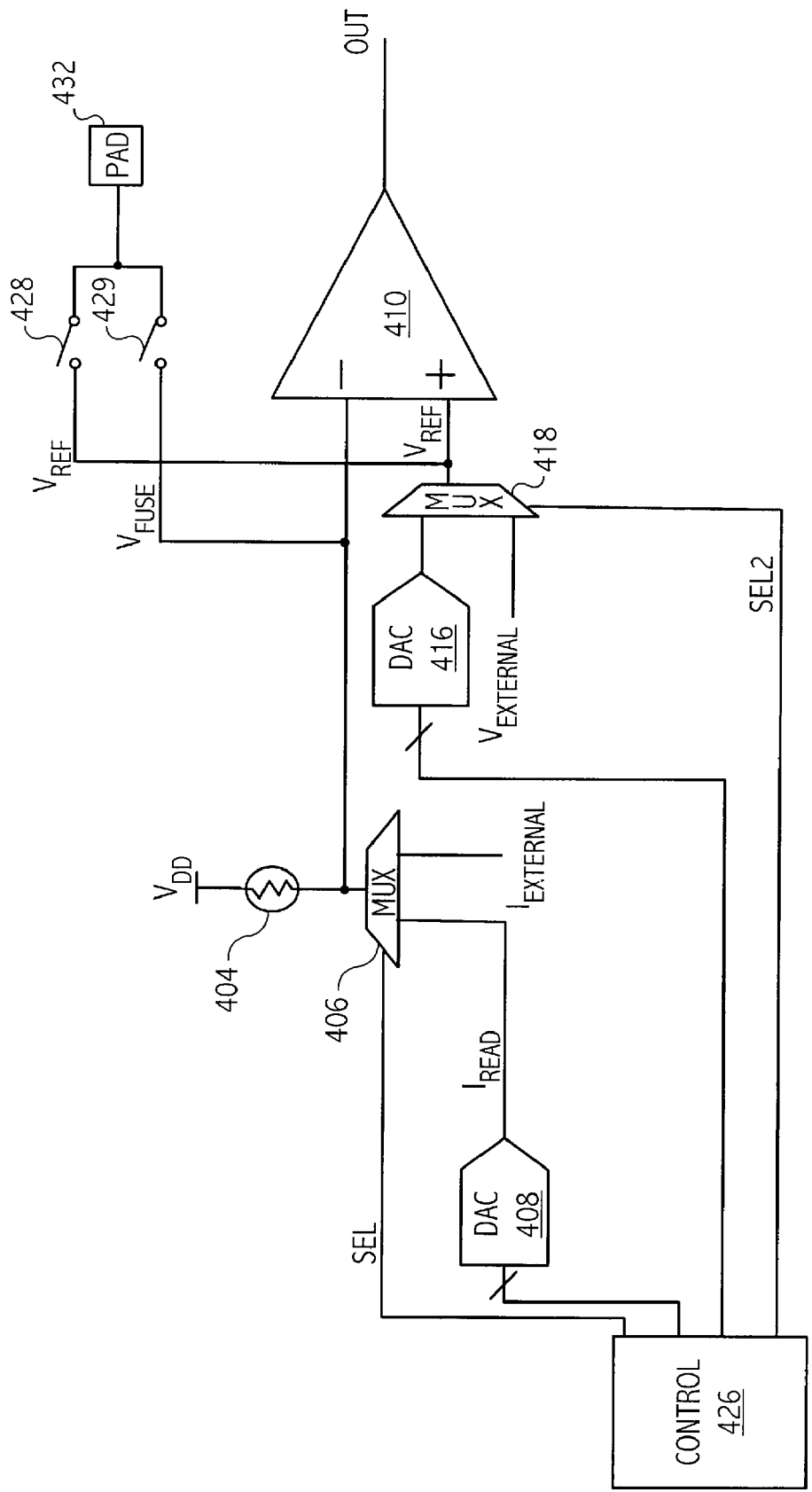
Figure 4D:
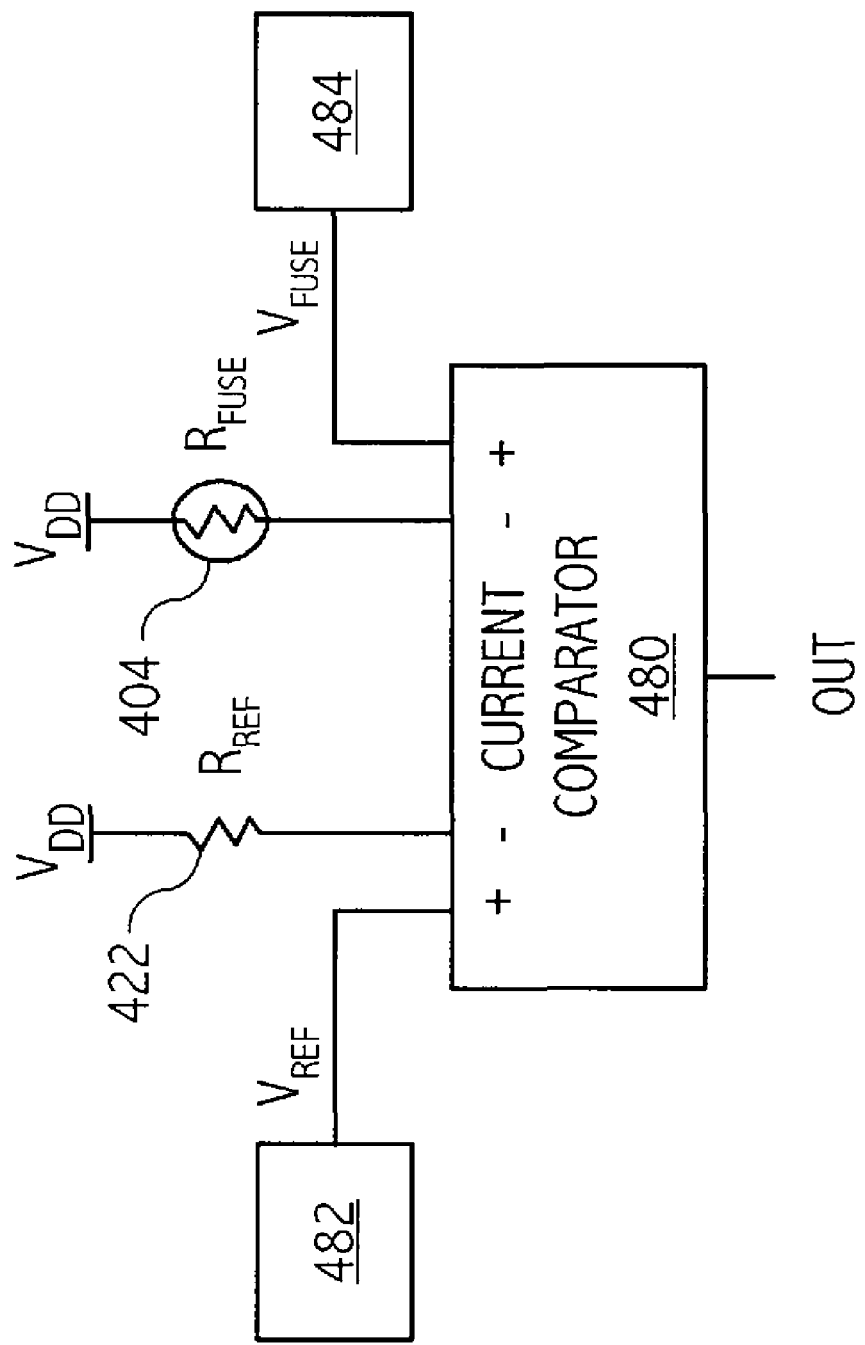

Referring to FIG. 4C, in at least one embodiment of a fuse-based circuit, both $V_{REF}$ and $I_{READ}$ are digitally controllable. Control circuit 426 may vary $V_{REF}$ and/or $I_{READ}$. By monitoring the output of differential amplifier circuit 410 as a function of known values of $V_{REF}$ and $I_{READ}$, e.g., consistent with techniques described above, the value of $R_{FUSE}$ and the associated amount of slice margin may be determined for a particular $V_{REF}$. In addition control circuit 426 may vary the digital control word based on those determined values to approximate a target resistance threshold level of circuit 400. Referring to FIG. 4D, in at least one embodiment of a fuse-based circuit, rather than using a differential amplifier circuit that compares voltage levels, a current comparator circuit (e.g., current comparator circuit 480) compares a current level through the fuse circuit to a reference current level and generates a digital signal indicative of the difference. One or both of voltage reference generators circuits 482 and 484 may be digitally programmable according to a digital word and any suitable current comparator circuit may be used.

Figure 5A:
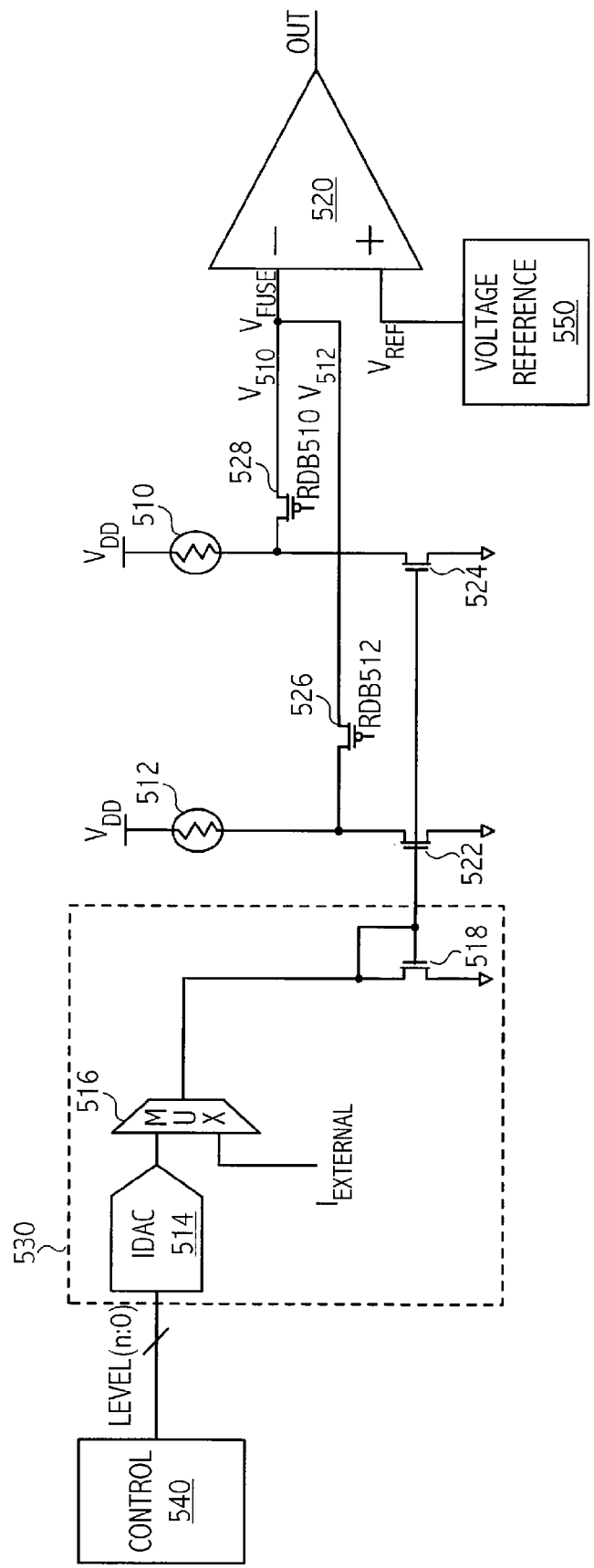
FIGS. 5A and 5B illustrate exemplary configurations of fuse circuits and shared circuitry consistent with at least one embodiment of the invention.

Referring to FIG. 5A, in at least one embodiment of a fuse-based circuit, a single differential amplifier circuit (e.g., differential amplifier circuit 520) is used to sense voltages associated with multiple, distinct fuse circuits (e.g., fuse circuits 510 and 512). In addition, a digitally controllable current is generated for each of those fuse circuits using shared circuitry. For example, current generator circuit 530 includes digital-to-analog converter circuit 514 and generates a current based on a multi-bit digital signal (e.g., LEVEL (n:0)) provided by a control circuit (e.g., control circuit 540). A current selected from the internally generated digitally controllable current and an externally generated current (e.g., $I_{EXTERNAL}$) is provided to a current mirror circuit, which generates a mirrored current through one or more of fuse circuits 512 and 510. In at least one embodiment of a fuse-based circuit, only a mirroring device (e.g., device 522 or 524) is replicated for each fuse circuit and the remainder of the digitally controllable current generator circuitry is shared by the multiple fuse circuits.

Analog switch circuits (e.g., devices 526 and 528) are used to provide a voltage associated with a selected one of the fuse circuits to differential amplifier circuit 520. Differential amplifier circuit 520 generates a digital output signal based on the signal provided by the selected fuse circuit and on a reference voltage (e.g., $V_{REF}$) provided by voltage reference generator circuit 550. Voltage reference generator circuit 550 may provide a reference voltage, $V_{REF}$, generated internally or externally by any suitable technique. The digital output signals generated by differential amplifier circuit 520 are used for individual characterization of corresponding selected fuse circuit(s).

Figure 5B:
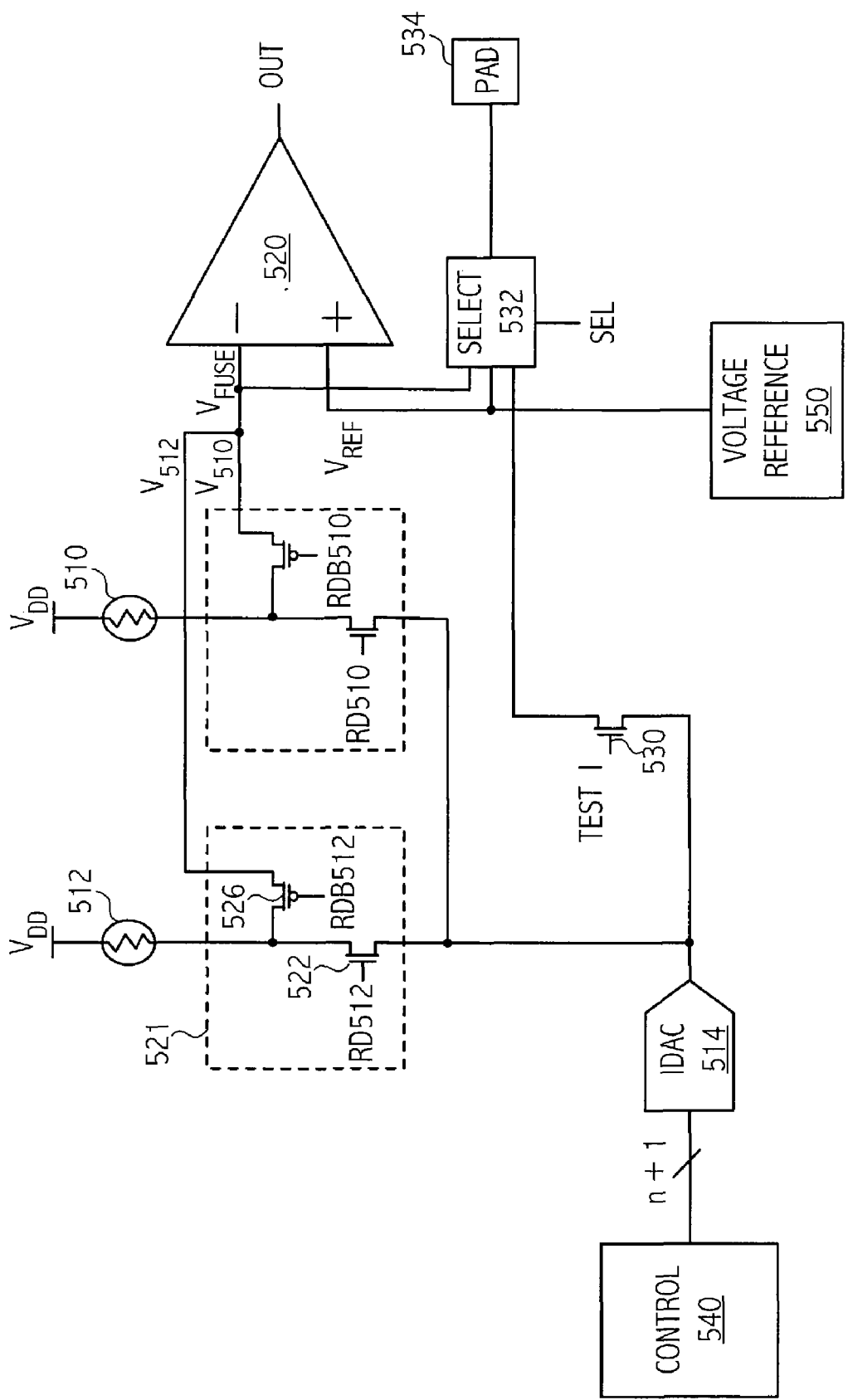

Referring to FIG. 5B, in at least one embodiment of a fuse-based circuit, each fuse circuit is associated with at least corresponding select circuitry. For example, unit cell 521 includes devices 526 and 522, which selectively couple fuse circuit 512 to differential amplifier circuit 520 and selectively provide a read current to fuse circuit 512 according to at least one select signal (e.g., RD512 and RDB512). In at least one embodiment of the fuse-based circuit, the select signal(s) are based on an output of an address decoder (not shown) and a read signal, which may be generated by control circuit 540. In at least one embodiment of the fuse-based circuit, a unit cell (e.g., unit cell 521) includes additional circuitry (not shown) for programming a corresponding fuse circuit (e.g., fuse circuit 512). For example, the unit cell may include a relatively large transistor to provide a relatively large current needed to program the fuse according to at least one signal generated by the address decoder and a write select signal, which may be generated by control circuit 540. In at least one embodiment of a fuse-based circuit, a select circuit (e.g., select circuit 532, which includes analog switches) selectively provides $V_{FUSE}$ or the output current of IDAC 514 (e.g., using device 530) to pad 534 to facilitate measurement of the fuse resistance by external resources. In addition, select circuit 532 may also be configured to provide $V_{REF}$ or $I_{READ}$ from a source external to the integrated circuit (e.g., via pad 534) or from a source external to the fuse-based memory circuit via a node of the integrated circuit external to the fuse-based memory circuit.

Figure 6:
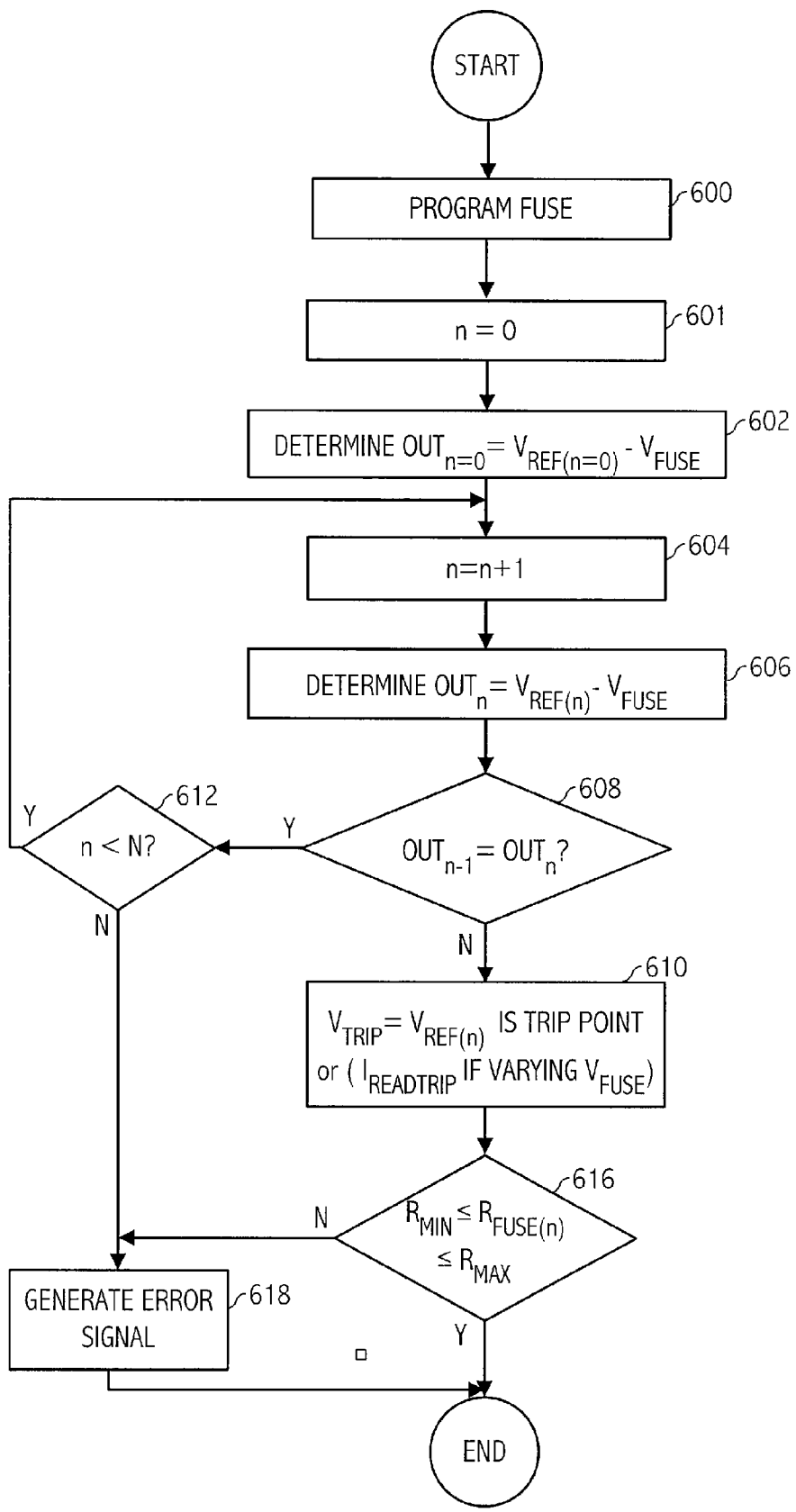
FIG. 6 illustrates exemplary information and control flows consistent with at least one embodiment of the invention.

During a programming mode of an integrated circuit including fuse circuits described herein, the fuse resistance may be determined. Referring to FIG. 6, a particular fuse circuit is selected by a control circuit for characterization. The digitally controllable reference voltage (or digitally controllable current), may be varied until a corresponding trip point is detected. The digitally controllable reference voltage (e.g., $V_{REF}$) may be varied over N values (e.g., $V_{REF(n)}$ where $0<=n<=N-1$). For example, the fuse circuit may be programmed (600). Then, the value of an index (e.g., index n) may be initialized (601). The output of differential amplifier (e.g., $V_{REF(0)}-V_{FUSE}$) is monitored and one or more measured outputs corresponding to $V_{REF(0)}$ may be stored in memory (602). The next value of the reference voltage (e.g., $V_{REF(1)}$) is determined, for example, by incrementing n (604) and the output of the differential amplifier is monitored and stored in memory (606). The control circuit then compares the output value corresponding to a current value of $V_{REF}$ to the output value corresponding to a previous value of $V_{REF}$ for that fuse circuit (608).

If no trip point is detected for the entire range of n (612), then the fuse may not have been programmed properly and/or $R_{FUSE}$ may not be in a target range. A control circuit may then generate an error signal (618). In response to the error signal, a control circuit may restart fuse programming or initiate other suitable action. If no trip point has been detected and n is less than a maximum value (e.g., N-1), then n is incremented (604) and monitoring of the output of the differential amplifier continues (606). If a trip point is detected, an approximate value of $R_{FUSE}$ may be determined based on the precision of the $V_{REF}$ value and a known current flowing through $R_{FUSE}$. If $R_{FUSE}$ for the current index n is not within a particular range (e.g., the range of values between $R_{MAX}$ and $R_{MIN}$, inclusively) (616), then the control circuit may generate an error signal (618). In response to the error signal, the control circuit may restart programming of the fuse (600) or initiate other suitable action. In at least one embodiment of a control circuit, rather than vary $V_{REF}$, $V_{FUSE}$ may be varied and compared to a fixed $V_{REF}$ to determine a trip point of the circuit. Although FIG. 6 illustrates performing measurements (e.g., 601-616) after programming of the fuse circuit, similar measurements may also be made prior to programming of the fuse circuit.

Figure 7:
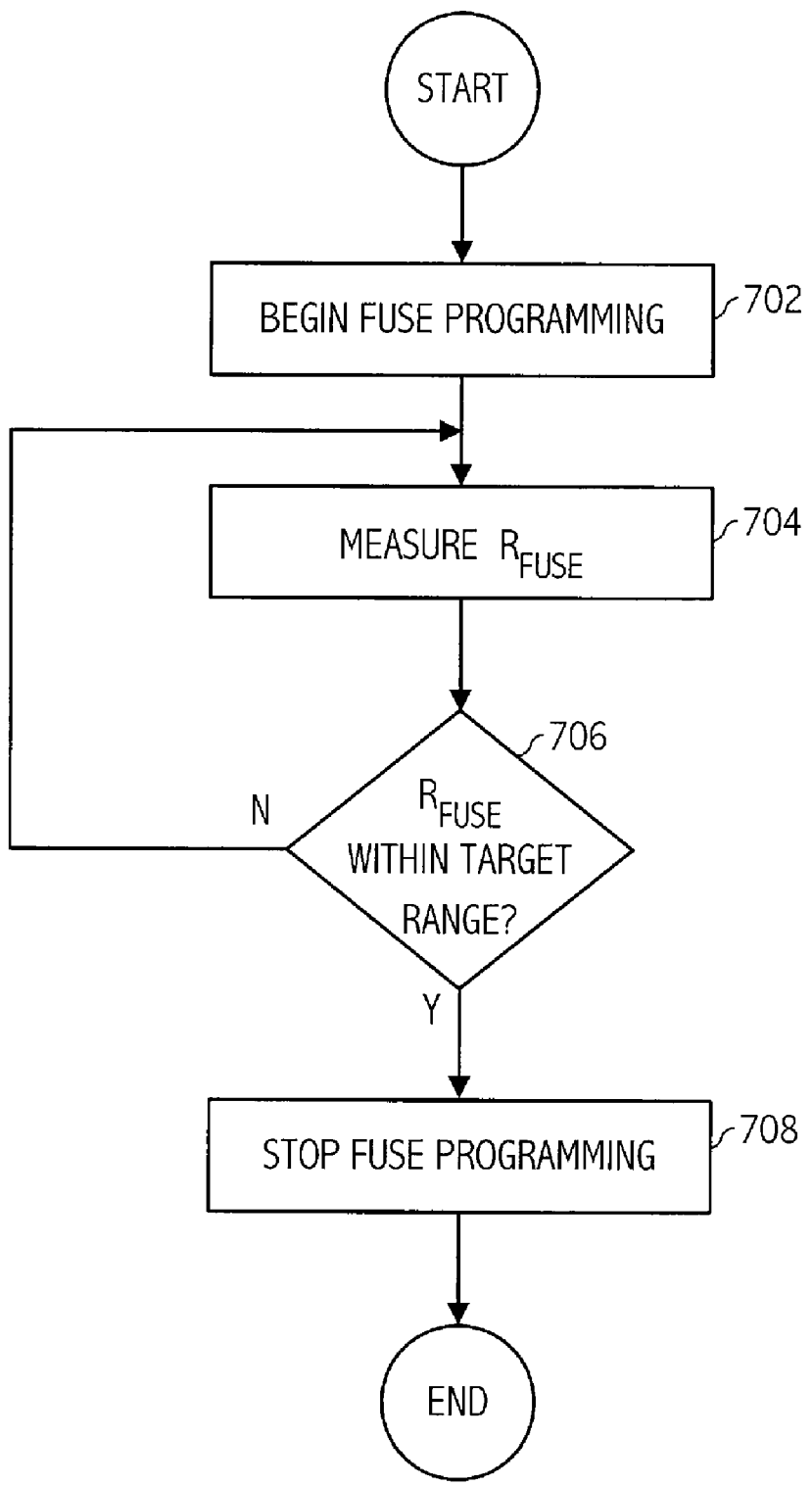
FIG. 7 illustrates exemplary information and control flows consistent with at least one embodiment of the invention.

Referring to FIG. 7, in at least one embodiment of a fuse-based circuit, a control circuit may begin programming a fuse circuit (702) and continuously monitor the fuse resistance while programming the fuse circuit (704). Measurements may be made consistent with techniques described above with regard to FIG. 6 or by any other suitable technique. If the fuse resistance is within a target resistance range (706), the control circuit stops the programming of the fuse (708). If the fuse resistance is not within a target resistance range and a fuse programming time has not yet expired, the control circuit may continue to monitor the fuse resistance during continued fuse programming (704). This technique may reduce the overall programming time of a non-volatile memory including fuse devices and provide increased confidence in the programmed resistances of the fuse devices.

Figure 8:
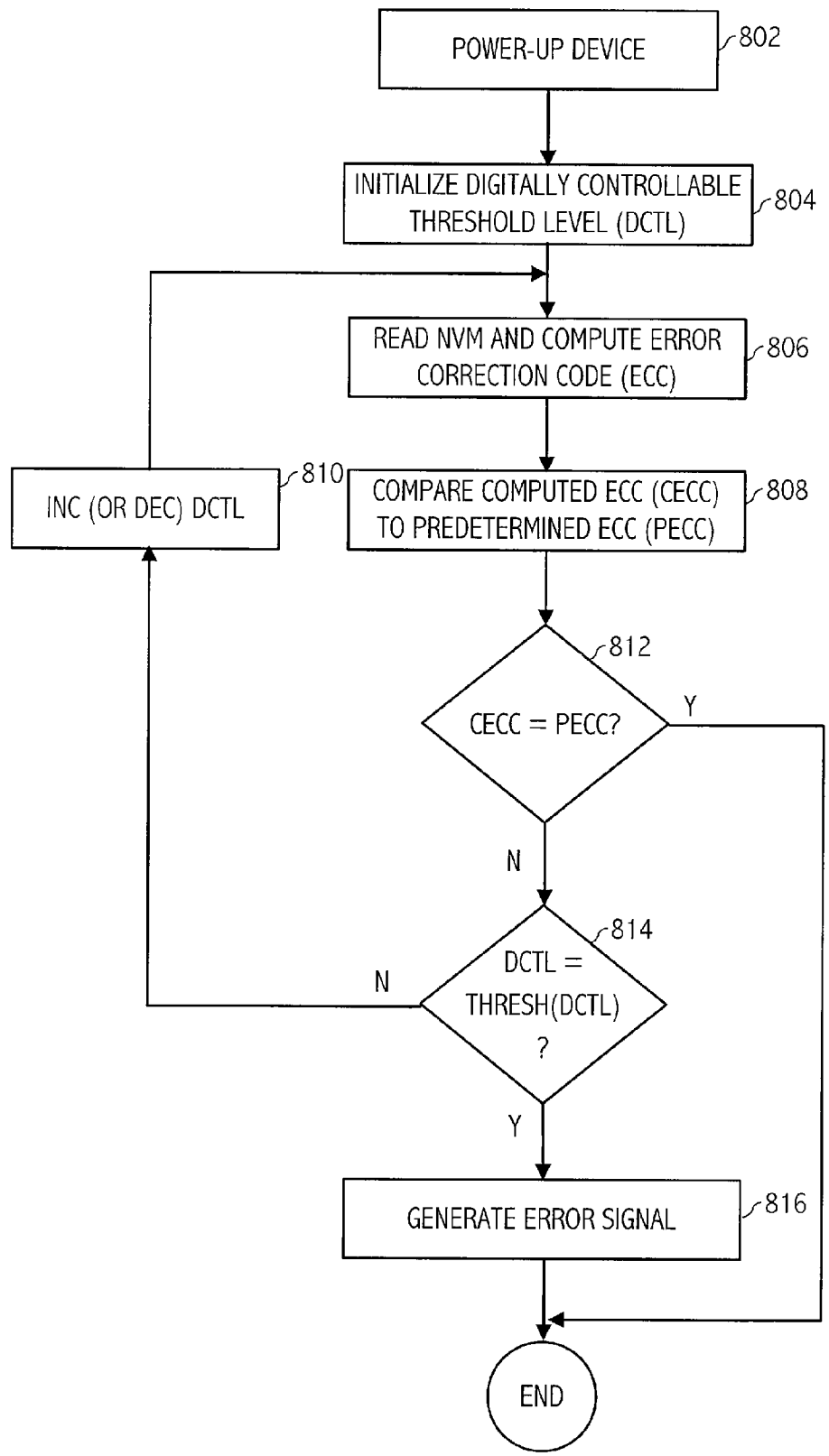
FIG. 8 illustrates exemplary information and control flows consistent with at least one embodiment of the invention.

Referring to FIG. 8, in at least one embodiment of a fuse-based memory, the resistance threshold of the system may be varied to reduce or eliminate errors when reading the fuse-based memory and/or identify defective fuse-based memory circuits. For example, following power-up of the fuse-based memory (802), a digitally controllable threshold level for the system is initialized (804). This value may be configured by dedicated control circuitry (e.g., control circuit 426 of FIGS. 4A-C or control circuit 540 of FIGS. 5A and 5B). A control circuit reads the non-volatile memory circuit (e.g., a circuit including an array of fuse-based devices) and computes an error correction code (ECC) (806). The control circuit compares the computed ECC to a predetermined ECC (808). If the computed ECC and the predetermined ECC are equal (812), then no error is detected. If the computed ECC and the predetermined ECC are unequal (812), then an error is detected.

In response to detecting an error and if the digitally controllable threshold level is not equal to a threshold level (a maximum or minimum value of the digitally controllable threshold level) then the digitally controllable threshold level is adjusted (i.e., incremented or decremented) (810), the non-volatile memory circuit is read again using the new threshold level and the ECC is recomputed. If adjustments to the digitally controllable threshold level have reached a maximum or minimum value for the digitally controllable threshold level and results in a difference in the computed ECC and predetermined ECC, an error signal is generated (816).

While circuits and physical structures are generally presumed, it is well recognized that in modern semiconductor design and fabrication, physical structures and circuits may be embodied in computer-readable descriptive form suitable for use in subsequent design, test or fabrication stages. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer-readable medium includes at least disk, tape, or other magnetic, optical, semiconductor (e.g., flash memory cards, ROM), or electronic medium.

The description of the invention set forth herein is illustrative, and is not intended to limit the scope of the invention as set forth in the following claims. For example, although the invention is described with regard to fuse devices included in a non-volatile memory circuit, a fuse device may be used in other applications, e.g., to form connections, program elements for redundancy, or trim analog circuits by adjusting the resistance of a current path. Techniques described herein are applicable to determining a resistance value and slice margin in those other applications. Variations and modifications of the embodiments disclosed herein, may be made based on the description set forth herein, without departing from the scope and spirit of the invention as set forth in the following claims.

What is claimed is:

1. A circuit comprising:
   a fuse circuit;
   a comparator circuit configured to compare a first signal indicative of a resistance of the fuse circuit to a second signal indicative of a reference level, at least one of the first and second signals being digitally controllable, the comparator circuit being configured to generate a digital output signal indicative of the comparison;
   a control circuit configured to digitally control the at least one of the first and second signals that is digitally controllable at least partially based on the digital output signal.

2. The circuit, as recited in claim 1, wherein the first signal is a voltage on a node coupled to the fuse circuit and the comparator circuit and the second signal is a reference voltage on a node coupled to the comparator circuit.

3. The circuit, as recited in claim 1, wherein the first signal is a current through the fuse circuit and the second signal is a reference current.

4. The circuit, as recited in claim 1, wherein the at least one of the first and second signals is digitally controllable to generate a reference voltage based on the reference level and a current through the fuse circuit, the ratio of the reference voltage level to the current being approximately a target resistance threshold level.

5. A circuit comprising:
   a fuse circuit;

a comparator circuit configured to compare a first signal indicative of a resistance of the fuse circuit to a second signal indicative of a reference level, at least one of the first and second signals being digitally controllable, the comparator circuit being configured to generate a digital output signal indicative of the comparison; and a first digital-to-analog converter circuit configured to generate a first analog signal based on at least a first plurality of digital signals, the first signal being at least partially based on the first analog signal;

wherein the fuse circuit comprises a plurality of individual fuse circuits selectively coupled to the comparator circuit.

6. The circuit, as recited in claim 5, further comprising:
a second digital-to-analog converter circuit configured to generate a second analog signal based on at least a second plurality of digital signals, the second signal being at least partially based on the second analog signal.

7. The circuit, as recited in claim 5,
wherein the plurality of individual fuse circuits are selectively coupled to be responsive to the first analog signal.

8. A circuit comprising:
a fuse circuit;
a comparator circuit configured to compare a first signal indicative of a resistance of the fuse circuit to a second signal indicative of a reference level, at least one of the first and second signals being digitally controllable, the comparator circuit being configured to generate a digital output signal indicative of the comparison; and
a monitor circuit comprising at least one switch circuit for selectively coupling a terminal of an integrated circuit including the circuit to a selected one of a first input terminal of the comparator and a second input terminal of the comparator.

9. The circuit, as recited in claim 5, further comprising:
a control circuit configured to digitally control the at least one of the first and second signals that is digitally controllable at least partially based on the digital output signal.

10. The circuit, as recited in claim 1, further comprising:
wherein the control circuit is configured to program the fuse circuit in response to the digital output signal indicating the resistance of the fuse circuit being outside a first range of resistances.

11. The circuit, as recited in claim 1, further comprising:
wherein the control circuit is configured to set at least one of the first and second signals that is digitally controllable to a predetermined value in response to a reset condition of the circuit.

12. The circuit, as recited in claim 1, further comprising:
wherein the control circuit is configured to compare an expected error correction code to an error correction code computed at least partially based on a read of a memory circuit including the fuse circuit and configured to generate a signal indicative thereof.

13. A method comprising:
digitally controlling at least one of a first signal indicative of a resistance of a fuse circuit and a second signal indicative of a reference level, and generating a digital output signal indicative of a comparison of the first and second signals,
wherein the at least one of the first and second signals is digitally controlled at least partially based on the digital output signal.

14. The method, as recited in claim 13, wherein the first and second signals are digitally controlled to generate a reference voltage based on the reference level and a current through the fuse circuit, the ratio of the reference voltage level to the current through the fuse circuit being approximately a target resistance threshold level.

15. The method, as recited in claim 13, wherein the first signal is a voltage at least partially based on a read current flowing through a terminal of the fuse circuit and the second signal is a reference voltage.

16. The method, as recited in claim 13, further comprising:
changing the resistance of the fuse circuit at least partially based on the digital output signal.

17. The method, as recited in claim 13, further comprising:
determining the resistance of the fuse circuit at least partially based on the digital output signal.

18. The method, as recited in claim 13, further comprising:
determining a slice level margin of a memory circuit including the fuse circuit at least partially based on the digital output signal.

19. The method, as recited in claim 13, wherein the digitally controlling is at least partially based on detecting an error in a logical value associated with a memory circuit including the fuse circuit, the error being detected at least partially based on an expected error detection code and an error correction code based on the digital output signal.

20. An apparatus comprising:
a fuse circuit on an integrated circuit;
a comparator circuit configured to generate a digital output signal indicative of a difference between a first signal indicative of a fuse resistance and a second signal indicative of a reference level; and
means for digitally controlling at least one of the first signal and the second signal to characterize the fuse circuit, the means for digitally controlling being on the integrated circuit,
wherein the means for digitally controlling is responsive to the digital output signal.

21. The apparatus, as recited in claim 20, wherein the first signal is a voltage on a node coupled to the fuse circuit and the second signal is a reference voltage.

22. The apparatus, as recited in claim 20, wherein the means for digitally controlling comprises at least one digital-to-analog converter circuit responsive to a plurality of digital signals.

23. The circuit as recited in claim 1, further comprising:
a first digital-to-analog converter circuit configured to generate a first analog signal based on at least a first plurality of digital signals, the first signal being at least partially based on the first analog signal; and
a second digital-to-analog converter circuit configured to generate a second analog signal based on at least a second plurality of digital signals, the second signal being at least partially based on the second analog signal.

24. The circuit as recited in claim 1, further comprising:
a monitor circuit comprising at least one switch circuit for selectively coupling a terminal of an integrated circuit including the circuit to a selected one of a first input terminal of the comparator and a second input terminal of the comparator.

* * * * *